United States Patent [19]
Holmes et al.

[11] Patent Number: 5,491,415
[45] Date of Patent: * Feb. 13, 1996

[54] MAGNETIC RESONANCE SCANNER WITH IMPROVED PACKAGING FOR CIRCUITRY WITHIN THE MAGNETIC FIELD

[75] Inventors: Timothy B. Holmes, Solon; Paul M. Scsavnicki, Mentor, both of Ohio

[73] Assignee: Picker International, Inc., Highland Hts., Ohio

[ * ] Notice: The portion of the term of this patent subsequent to Mar. 22, 2011, has been disclaimed.

[21] Appl. No.: 186,297

[22] Filed: Jan. 21, 1994

Related U.S. Application Data

[63] Continuation-in-part of Ser. No. 847,796, Mar. 5, 1992, Pat. No. 5,296,813.

[51] Int. Cl.$^6$ ..................................................... G01V 3/00
[52] U.S. Cl. .......................................... 324/322; 324/318
[58] Field of Search .................................... 324/300, 312, 324/313, 318, 320, 322; 128/653.5

[56] References Cited

U.S. PATENT DOCUMENTS

| | | | |
|---|---|---|---|
| 4,721,913 | 1/1988 | Hyde et al. | 324/318 |
| 4,816,765 | 3/1989 | Boskamp | 324/318 |
| 4,918,388 | 4/1990 | Mehdizadeh et al. | 324/322 |
| 4,920,318 | 4/1990 | Misic et al. | 324/318 |
| 5,076,275 | 12/1991 | Bechor et al. | 128/653 |
| 5,296,813 | 3/1994 | Holmes et al. | 324/322 |

OTHER PUBLICATIONS

"High Temperature Packaging: Flip Chip on Flexible Laminate", Surface Mount Technology, Jan. 1992, vol. 6, No. 1.
"Electronic Packaging and Interconnection Handbook", Ed. Harper, McGraw—Hill, Inc. 1991, pp. 10.23–10.57.
"Electronic Packaging, Microelectronics, and Interconnection Dictionary", Ed. Harper, et al., McGraw—Hill, Inc. 1993, pp. 30–31, 37, 54, 57–58, 61, 97–98, 103, 138–139, 190–191, 213.
"Microsemi Data Book", Microsemi Corporation, 1991, pp. 309, 342–343.
"M/A–COM Semiconductor Products", M/A–COM, Inc., 1988, pp. 1–14.

Primary Examiner—Louis M. Arana
Attorney, Agent, or Firm—Fay, Sharpe, Beall, Fagan, Minnich & Mckee

[57] ABSTRACT

A magnetic resonance imaging apparatus defines an examination region (14) within which main magnets (10) create a uniform magnetic field. Magnetic resonance is excited in dipoles of a subject within the examination region causing the generation of magnetic resonance signals that are received by either a localized coil (C) or whole body radio frequency coils (22). The radio frequency coils are disposed sufficiently adjacent the examination region that the coils are subject to magnetic fields and magnetic field gradients, that any ferrous metals would alter the magnetic field. Magnetic resonance signal processing circuits (54) which are mounted on the coil are free of ferrous materials, such as iron and nickel, to prevent distortion of the uniform magnetic field. The circuit includes an array of unpackaged component dice which are free of ferrous or other packaging. The dice are supported by an insulating substrate (62) to which they are attached by one of whiskers (82), solder bumps (82'), and electrical conductors (102) on a flexible tape (94). In one embodiment, the component dice include a transistor (Q1) and other circuit components for amplifying the received resonance signals. In another embodiment, the component dice include an analog-to-digital converter for digitizing the received magnetic resonance signals at the coil before noise signals received along connecting leads are superimposed onto the resonance signal. In yet another embodiment, an unpackaged microprocessor die is included for performing digital signal processing operations on the digitized magnetic resonance signals at the radio frequency coil.

18 Claims, 6 Drawing Sheets

MAGNETIC RESONANCE SCANNER WITH IMPROVED PACKAGING FOR CIRCUITRY WITHIN THE MAGNETIC FIELD

The present application is a continuation-in-part of U.S. application Ser. No. 07/847,796, filed Mar. 5, 1992, now U.S. Pat. No. 5,296,813.

BACKGROUND OF THE INVENTION

The present invention relates to the art of processing information within magnetic fields. It finds particular application in conjunction with amplifiers for radio frequency pick-up coils in magnetic resonance imaging apparatus and will be described with particular reference thereto. However, it is to be appreciated that the invention will also find application in conjunction with packaging for other circuitry positioned within the magnetic field of magnetic resonance imaging and spectroscopy apparatus and the like.

Conventionally, patient encircling coils generate a static magnetic field through a patient examination region within their bore. Gradient magnetic field coils and RF coils are typically positioned concentrically within the static magnetic field coils, but outside the central examination region. The gradient magnetic field and radio frequency coils are controlled to generate corresponding gradient magnetic field and RF pulses for various magnetic resonance sequences, as is known in the art. Typically, the radio frequency coil can also be utilized to receive the relatively weak (as compared to the RF pulses of the magnetic resonance excitation sequence) magnetic resonance signals emanating from the subject as a result of the magnetic resonance sequence. Signals received by the radio frequency coil are conveyed by leads to an amplifier disposed sufficiently remote from the coils that it is shielded from the magnetic fields.

For some imaging procedures, a surface radio frequency coil is positioned within the examination region, typically firmly against a surface of the subject. This places the coil for receiving the magnetic resonance signals much closer to assist in receiving weaker signals, to limit the region of the subject from which magnetic resonance signals are received, and the like. Typically, the signals from the surface coils are conveyed over non-ferrous conductor cables to an amplifier located externally of the static magnetic field, typically a distance of a meter or more from the patient. The lead, to a certain extent, function as an antenna for picking up unwanted signals and noise which the amplifier amplifies along with the relatively weak magnetic resonance signals.

Placing the amplifier on the whole body radio frequency coil or surface coil could raise the amplitude of the magnetic resonance signal several orders of magnitude above the noise picked up on the leads. However, conventionally available circuit components include ferrous materials which would distort the magnetic field and be subject to torques exerted by the magnetic fields. Because the whole body radio frequency coils and the surface coils are positioned very close to the examined region of interest, any ferrous components can cause unacceptably large distortions in the static magnetic field and the resultant image.

Readily available circuit components, such as diodes, transistors, microprocessors, and the like include steel in their packaging. More specifically, the lead wires and connectors are typically fabricated of steel. High quality components with "gold" leads actually have gold plated steel leads.

Having a component developed which includes no steel or nickel in its packaging is a time consuming and expensive undertaking. Many component companies are unwilling to invest the time and resources necessary to develop non-ferrous packaging for the components. Those suppliers which will, require long lead times, typically on the order of 3–9 months. Moreover, the components which are supplied are several hundred times more expensive than their steel packaged counterparts.

In high volume consumer electronics applications, where small size is very important, chip and wire hybrid, chip on board, tape automated bonding, flip chip, and other technologies have been utilized. In these technologies, the active and other components of a given circuit are adhered directly to a circuit board or substrate without being encased in a steel or other housing. Appropriate whiskers or other electrical interconnections are provided and the entire package is encapsulated in epoxy. Due to developmental costs, the use of these circuits is limited to less cost-sensitive applications. Even in high volume applications, these technologies are rarely utilized unless small size is important. Due to the low volume of magnetic resonance imagers and surface coils and because each different surface coil model would require a different amplifier circuit, these technologies have been considered inappropriate for magnetic resonance scanners.

Moreover, the circuit boards used in some of these technologies such as chip-on-board technology, like other circuit boards, include an epoxy fiberglass or polyamide substrate that is laminated with copper which is etched away to form appropriate circuit leads. A nickel flash is applied to the copper followed by gold plating. Nickel, however, is sufficiently ferro-magnetic to cause significant distortions in the static magnetic field in the region of interest of the subject.

Rather than standard circuit boards, wiring patterns can be drawn on ceramic substrate with gold ink and fired. This technique is generally used for prototyping or in less cost-sensitive applications. Thin film sputtering and etching can also be used to manufacture gold film on ceramic boards.

The present invention contemplates a new and improved technique which enables active components such as diodes, transistors, and integrated circuits to be mounted directly on surface coils and other components which are mounted within the examination region of a magnetic resonance apparatus.

SUMMARY OF THE INVENTION

In accordance with the present invention, a signal processing circuit is provided for mounting in or closely contiguous to a patient receiving region of a magnetic resonance apparatus. The circuit includes an insulating substrate on which a plurality of electrically conductive leads are defined. Electrically conductive portions of a plurality of ferrous-free, unpackaged component dice are connected directly to the electrically conductive leads.

In accordance with a more limited aspect of the present invention, the electrical connection between the electrically conductive portions of the dice and the lead lines is achieved by one of whiskers using wire bonding technology, solder bumps using flip chip technology, or conductive lines on flexible tape using automated tape bonding technology.

In accordance with a more limited aspect of the present invention, the circuit is mounted at a receiving coil and the dice include at least a ferrous-free, unpackaged analog-to-digital converter die for converting radio frequency magnetic resonance signals received by the receiving coil from analog format to digital format at the radio frequency coil.

In accordance with another more limited aspect of the present invention, a ferrous-free unpackaged microprocessor die is included for performing digital signal processing operations at the radio frequency coil.

In accordance with another more limited aspect of the present invention, the radio frequency receiving coil is one of a whole body coil permanently mounted around a patient receiving bore of the magnetic resonance apparatus and a surface coil which is selectively insertable into the patient receiving bore.

One advantage of the present invention is that it enables circuitry to be placed within the magnetic field, particularly within the examination region of a magnetic resonance apparatus.

Another advantage of the present invention is that it reduces costs relative to custom packaging and dedicated custom chips.

Another advantage of the present invention is that it reduces component acquisition time and makes components which are suitable for use in magnetic fields more readily available.

Another advantage of the present invention is that it enables amplifiers and digital processing circuitry to be mounted closely adjacent the bore, such as to the permanently fixed radio frequency coils that surround the bore.

Another advantage of the present invention is resides in its wide variety of applications including monitoring patient or other conditions in the bore as well as for actively controlling conditions or motion in the bore, e.g. computer controlled surgery.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
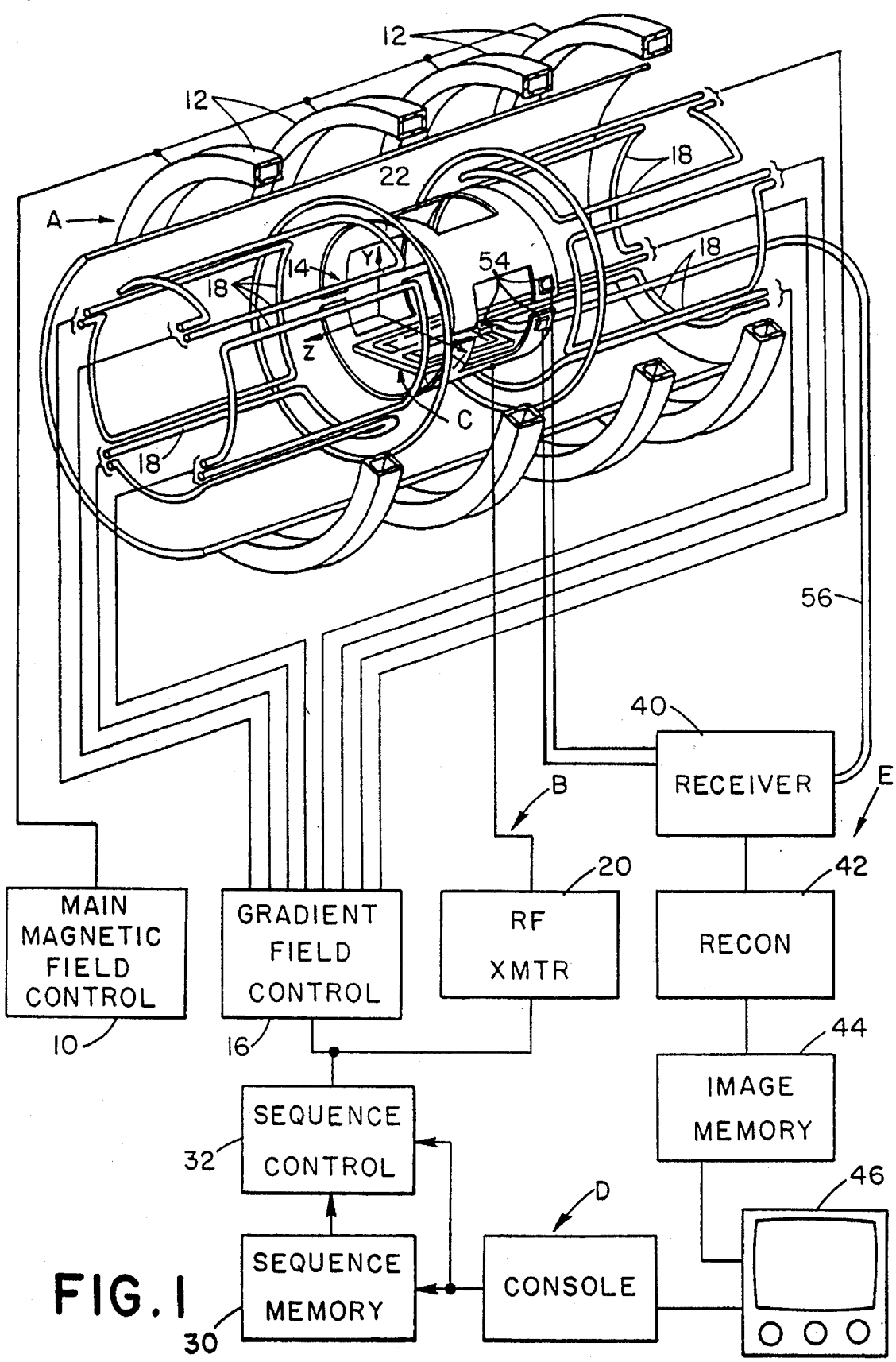
FIG. 1 is a diagrammatic illustration of a magnetic resonance imaging apparatus in accordance with the present invention.

With reference to FIG. 1, a magnetic resonance imaging apparatus includes a main magnetic field means A for establishing a static, uniform magnetic field longitudinally through an examination region along a z-axis. The magnetic field means selectively produces magnetic field gradients orthogonally across and along the main magnetic field of the examination region. A magnetic resonance excitation means B excites magnetic resonance in selected nuclei of a subject disposed in the examination region. The resonating nuclei generate radio frequency magnetic resonance signals which are received by a surface or localized coil C. More specifically, the surface coil is disposed in the examination region firmly against a surface of the subject near the region of interest within the subject such that it receives magnetic resonance signals from nuclei disposed in the region of interest. A control console or means D is controlled by an operator to cause one of a plurality of magnetic resonance sequences to be implemented. Electronic processing circuitry E converts the received magnetic resonance signals into an image representation indicative of nuclei density, relaxation time, position, nuclei characteristics, or the like.

The main magnetic field means A includes a magnetic field controlled circuit 10 and a plurality of high power superconducting or resistive magnets 12. The field control circuit 10 controls the magnets 12 such that a temporally constant magnetic field is generated through an examination region 14 in a central core thereof. A gradient magnetic field means includes a gradient magnetic field control circuit or means 16 which applies current pulses to gradient coils 18 to create magnetic field gradients, preferably linear gradients, across the main magnetic field in the examination region. Preferably, the gradient magnetic field control circuit causes linear gradients to be applied along each of three orthogonal x, y, and z-axes.

The resonance excitation means B includes a radio frequency transmitter 20 and an RF coil 22 to broadcast radio frequency (RF) signals that excite and manipulate magnetic resonance of dipoles of the subject within the examination region. The RF coil 22, in some modes of operation, is also used to receive magnetic resonance signals emanating from the examination region. In other modes of operation, the localized coil C is connected with a transmitter to apply the RF pulses to adjacent regions of the subject.

The control console D enables the operator to select among a plurality of magnetic resonance sequences and modes of operation. To select among different imaging sequences, the operator control console causes an electronic description of a selected magnetic resonance sequence to be withdrawn from a sequence memory 30 and loaded into a sequence control circuit 32. The sequence control circuit 32 causes the gradient field and RF pulses to be applied in accordance with the selected magnetic resonance sequence.

Magnetic resonance signals picked up by the localized coil C or the RF coil 22 are conveyed to a radio frequency receiver 40. Preferably, the receiver 40 is a digital receiver that receives and digitally demodulates the magnetic resonance signals. Demodulated signals from the receiver are conveyed to the electronic processing circuitry E. A reconstruction means 42 reconstructs image representations from the received magnetic resonance signals. If the magnetic resonance signals are not digitized an analog-to-digital converter is provided for digitizing the magnetic resonance signals before they are transferred to the reconstruction means 42. This enables the reconstruction means 42 to be embodied in a suitably programmed digital computer for implementing a two-dimensional inverse Fourier transform or other reconstruction process. The reconstructed image representations are stored in an image memory 44 and selectively displayed on a video monitor 46. Optionally, the image representations may be subject to further processing, archived to disk for long-term storage, or the like.

Figure 2:
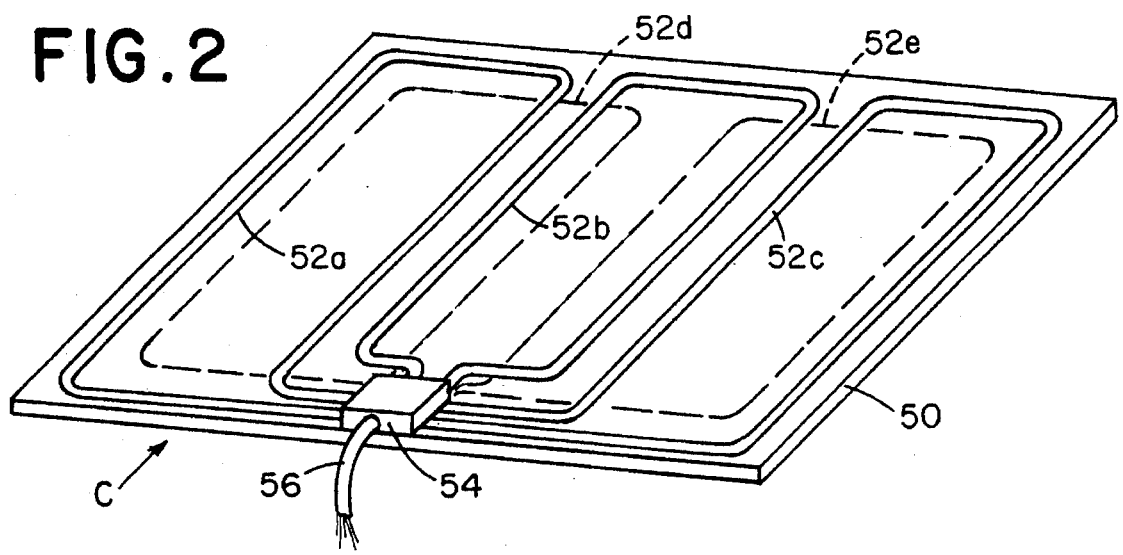
FIG. 2 illustrates a surface coil incorporating active circuit components in accordance with the present invention.

With continuing reference to FIG. 1 and further reference to FIG. 2, the localized coil C includes a substrate 50 of a non-ferrous, non-conductive material. The substrate may be a rigid material, e.g. a fiberglass reinforced epoxy material or flexible, e.g. a polyamide film. A plurality of non-ferrous circuit coil segments 52 are mounted on the substrate. The coil segments may be etched from continuous circuit board material, may be thin films applied to the substrate, discrete electrical conductors, or the like. In the illustrated embodiment, three generally rectangular loop segments 52a, 52b, and 52c are illustrated on a top surface of the substrate. However, it is to be appreciated that the localized coil may include a larger number of loops of different shapes and configurations, including loops on an opposite surface of the substrate 50 such as loops 52d and 52e. An on-coil resonance signal processing circuit 54 selectively performs one or more of a plurality of magnetic resonance signal processing functions including amplifying magnetic resonance signals from each of the coils sections, selectively interconnecting the coil segments in different combinations, selectively causing different coil segments to be active, digitizing signals received the coil segments, multiplexing magnetic resonance signals received by different coil segments or coil segment combinations, digitally demodulating or otherwise processing the received signals, and the like. The processed digital signals are carried on a lead 56 to the receiver 40.

In the preferred digital receiver embodiment, the on-coil resonance signal processing circuitry 54 is a portion of the digital receiver. The resonance signal processing circuit 54 includes at least the analog-to-digital converter such that digital rather than analog signals are conveyed from the resonance signal processing circuit 54. Preferably, a preamplifier is also included for preamplifying the analog resonance signals prior to the analog-to-digital conversion. Further, a microprocessor is provided for performing initial stages of the receiver function, e.g. digital demodulation. Analogous signal processing circuits 54 are also connected with the each segment of the radio frequency coil 22 for performing initial processing and receiver functions on these coils. In a quadrature radio frequency coil which has four segments, a resonance signal processing circuit 54 is mounted on or very closely adjacent each quadrature coil segment.

Figure 3:
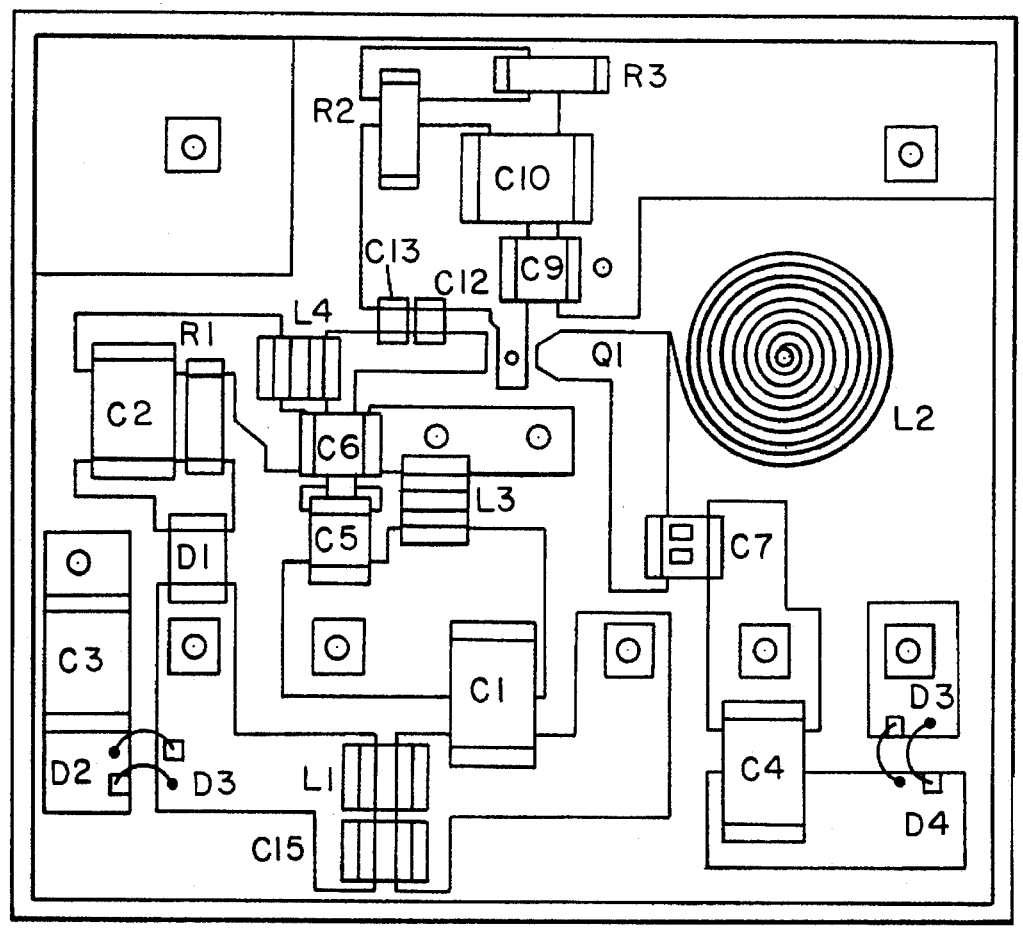
FIG. 3 is a top diagrammatic view of a preferred coil mounted amplifier.
Figure 4:
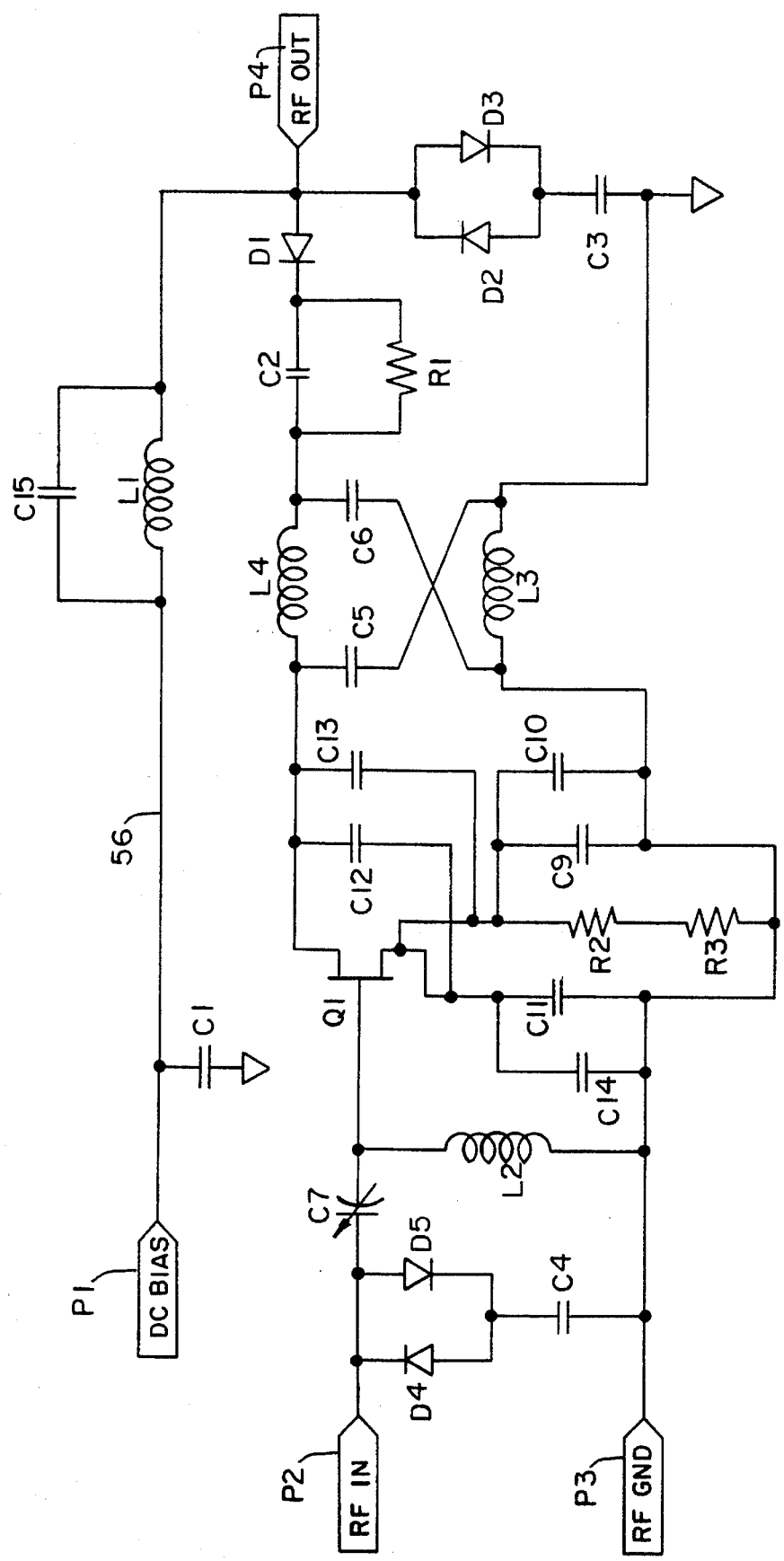
FIG. 4 is a circuit diagram of the amplifier of FIG. 3.

With reference to FIGS. 3 and 4, signals from the coil segments are received at pins P2, P3. Diodes D4 and D5 short high power RF signals, particularly the RF excitation signals which are applied by RF coil 22. Capacitor C7 and inductor L2 provide a tuned or resonance circuit, at the magnetic resonance frequency. A transistor Q1 amplifies the received magnetic resonance signals. The output of the transistor Q1 is connected through a tuned circuit for maximum signal transfer to an output pin P4 and the lead 56. Pin P is connected with lead 56 to receive a DC bias therefrom.

Each of the circuit components C1–C15, D1–D5, L1–L4, R1–R3, and Q1 are unjacketed, components with no steel, nickel, or other ferrous portions or leads. Electrical leads, particularly a gold film or ink, are silk-screened on the substrate 50. Gold whiskers are used to interconnect the components and leads into the circuit illustrated in FIG. 4. Preferably, a ceramic lid is sealed over the components of the processing circuit 54 for protection. Optionally, the components may be potted with epoxy, shielded with an aluminum lid, shielded with a plated, non-conductive lid, or the like. However, when potting the components, compensation should be made for the change in dielectric constants of the epoxy relative to air.

Figure 5:
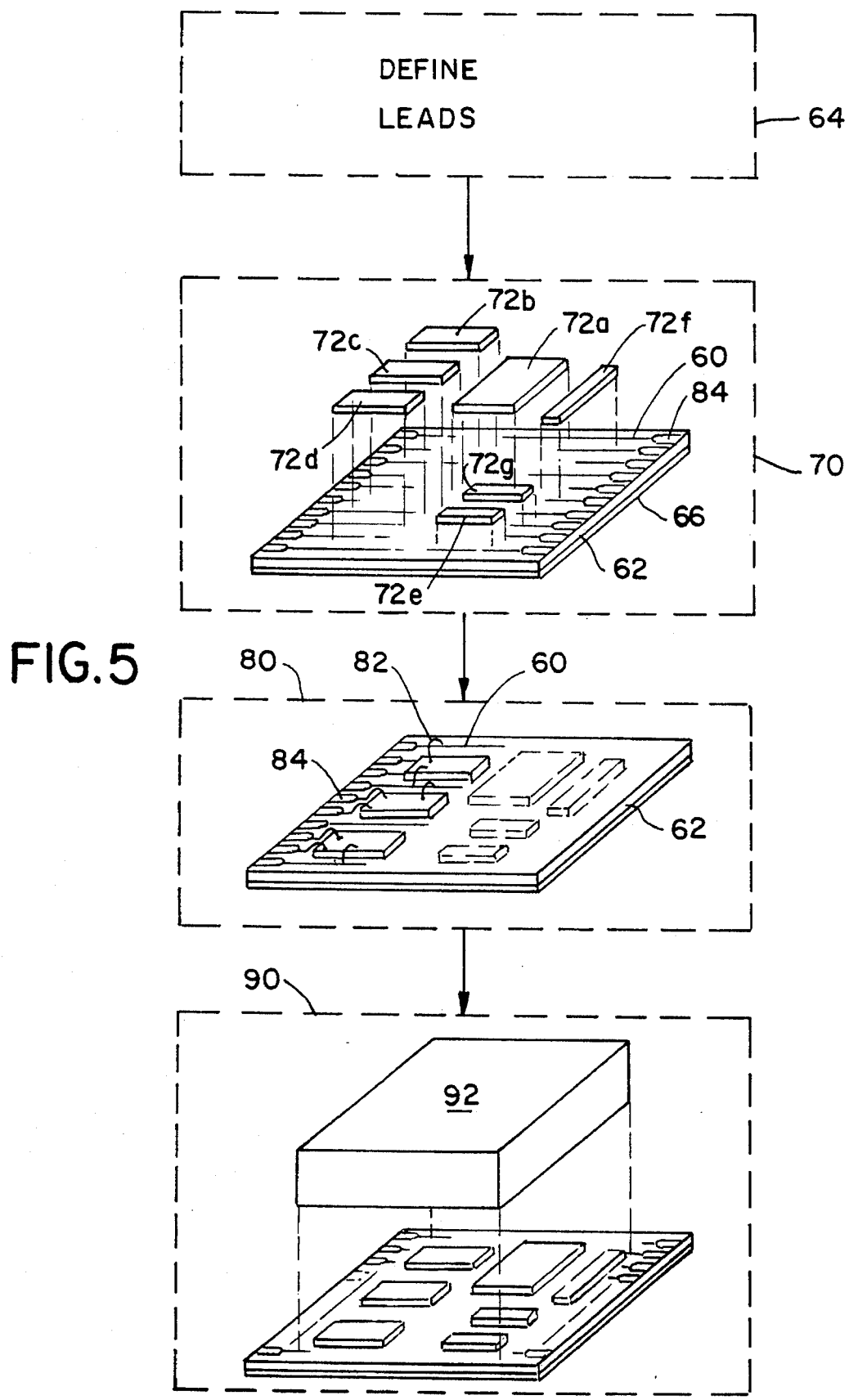
FIG. 5 illustrates a wire bonding method of manufacture.

With reference to FIG. 5, in a wire bonding technique, leads 60 are defined on a substrate 62 in a lead and passive components defining step 64. In a preferred embodiment, the lead and passive components defining step 64 includes silk-screening a selected lead pattern onto the substrate 62 and firing the substrate. Alternately, the lead lines may be drawn in gold ink with a computer controlled pen. Other techniques include thin film sputtering, green film, and other known techniques. Analogous steps may also be used in a multilayer technique to define thick film resistors, inductors, and capacitors.

In an adhering step 70, component dice, i.e. components without packaging, are stuck to the substrate 62 and appropriate lead lines 60 with conductive epoxy or solder eutectic. In the illustrated embodiment, diodes D1–D5 and transistor Q1 are bonded in this manner. Capacitors, inductors, resistors, and other discrete parts can be attached in this manner or can be adhered with solder paste followed by a subsequent reflow or soldering operation, rather than being deposited in the passive circuit component and lead line defining step 64.

Preferably, the lead defining step 64 further includes depositing a ground layer 66 to shield the circuit components or to provide a common ground. Optionally, multiple layers of leads may be provided separated by insulating layers, particularly where capacitors are defined with the lead lines. In an alternate embodiment, the component die array includes a mix of active component dice which are interconnectable to form a variety of processing circuits, e.g. a microprocessor 72a, a plurality of amplifiers 72b, an array of switching transistors 72c, an array of diodes 72d (preferably including at least some PIN diodes), a multiplexer 72e, analog-to-digital converters 72f, buffers 72g, and other integrated circuits. Other components such as light emitting diodes for converting the output signal to an optical signal, capacitors, inductors, resistors, and the like are also contemplated.

In a wire bonding step 80, the active components are electrically connected to the lead lines 60. Preferably, gold whiskers 82 are pressure bonded, welded, or otherwise connected to the appropriate layers of the component die and with the electrical leads 60.

Optionally, a lead connecting step is performed to connect non-ferrous electrical leads or pins with each lead lines 60 to enable the resultant construction to be inserted into a conventional or custom designed socket. The pins may be plated with gold or other corrosion resistant materials. Alternately, contact points 84 may be defined in the lead lines at the edges of the substrate or other means may be provided for facilitating interconnection with associated circuitry.

In an encasing step 90, the construction is sealed in a ceramic shell 92, encased in epoxy or other suitable polymers and cured, or the like for protection. Preferably, the shell is coated with a non-ferrous metal for shielding.

Figure 6:
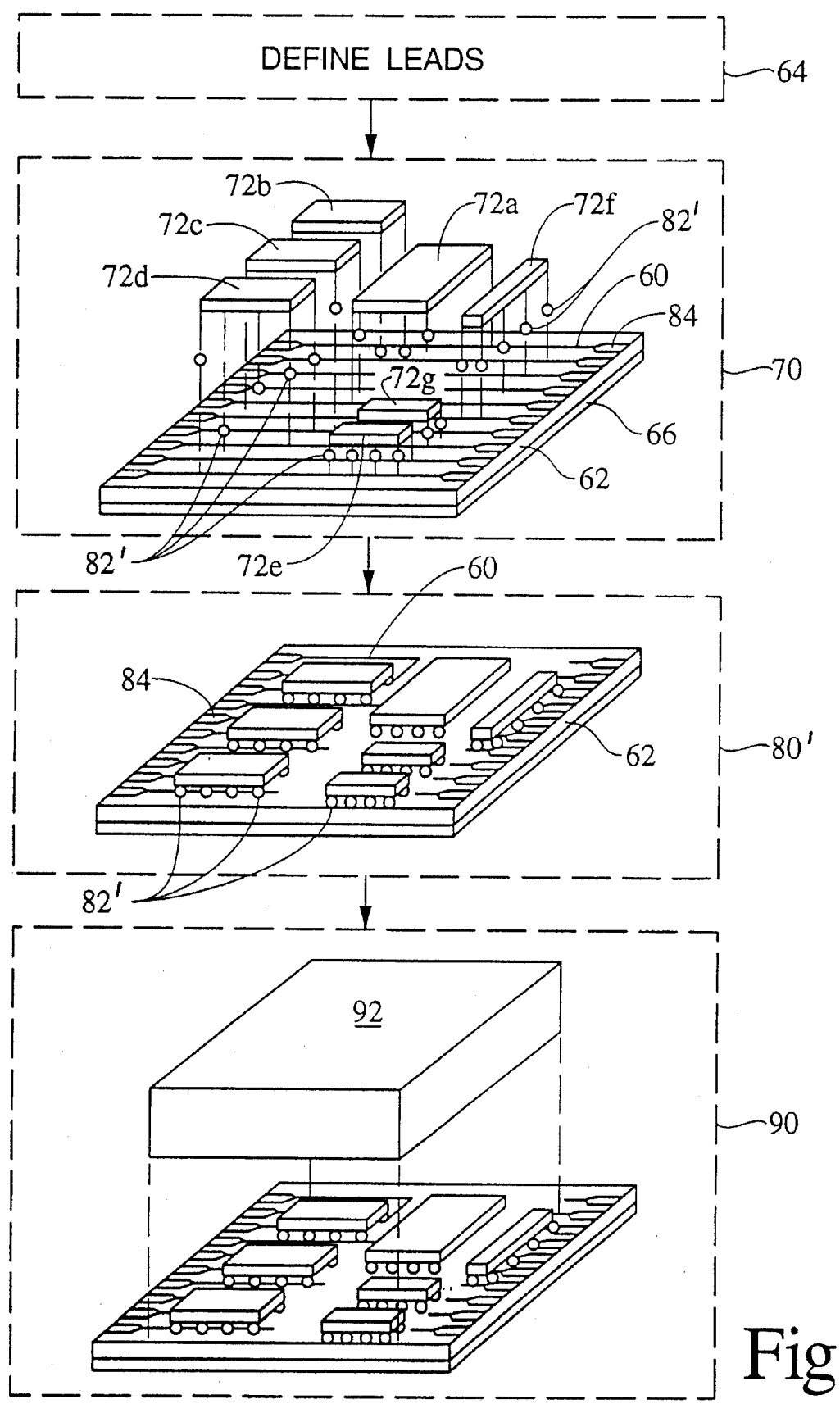
FIG. 6 illustrates a flip chip method of manufacture.

With reference to FIG. 6, in a flip chip manufacturing method, electrical lead lines 60 are again defined on a substrate 62 in a lead defining step 64. The lead-free dice 72 are disposed with their electrical contact points towards the substrate 62 in an orientation that is often considered "flipped". Solder bumps 82' are disposed between the electrical connections of the dice and the lead lines 60. For easier processing, the solder bumps are often adhered first to the lead lines in a first step and then to the die in a second step. In the preferred embodiment, the solder bumps are small spheres of copper which are coated with solder.

In a bonding step 80' heat is applied as the lead lines and dice are pressed together such that the solder forms an electrical connection with both the lead lines and the contact portions of the dice. The physical size of the copper sphere holds the die displaced from the substrate 62 and electrically insulated by the space from the lead lines 60.

In the encasing step 90, the construction is sealed in a ceramic shell 92, encased in epoxy or other suitable polymers, or the like for protection.

Figure 7:
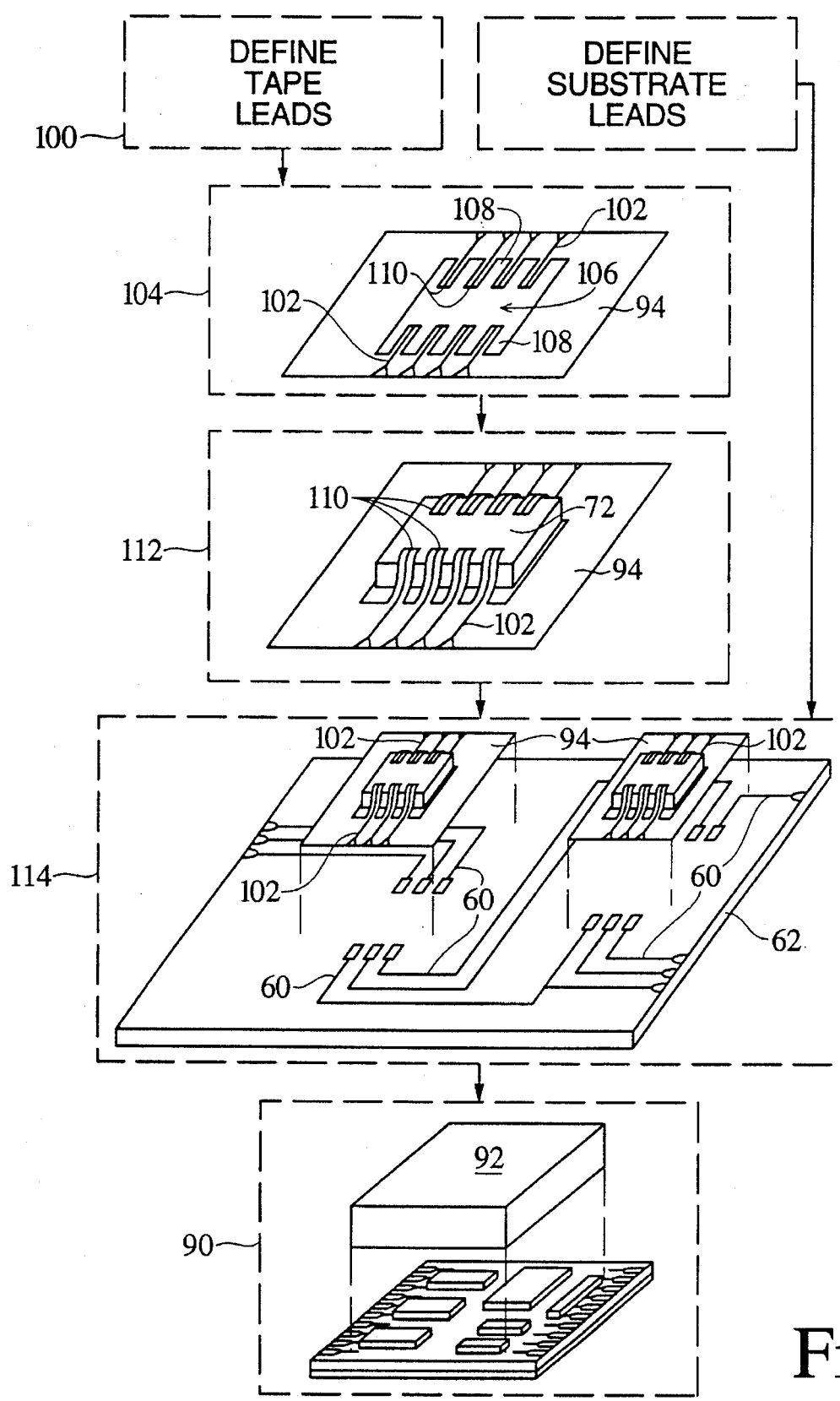
FIG. 7 illustrates a tape automated bonding method of manufacture.

With reference to FIG. 7, in a tape automated bonding or TAB technique, the dice 72 are first mounted to a flexible tape 94 which is, in turn, mounted to the substrate 60. More specifically, in a tape lead defining step 100, leads 102 are defined on the tape 94. In a window defining step 104, a window 106 is cut into the tape along with the slots 08 between adjacent leads. The ends of the leads form fingers 110 which can be flexed.

In a die inserting step 112, the die 72 is inserted into the aperture 106 with the fingers 110 flexing to accommodate it. The fingers are bonded to contact pads on the die analogous to the whiskers 82 in FIG. 5. That is, the tape defined leads may be pressure bonded, welded, or otherwise interconnected with the appropriate conductive layers of the component die. In an attaching step 114, the other ends of the leads 102 on the tape 94 are attached to leads 60 defined on a substrate 62. A multiplicity of tape and die assemblies are interconnected with each other by the leads 60 on various planes of the substrate 62.

Of course, other bonding techniques and combinations of these techniques may be utilized to mount the dice to the substrate. For example, microprocessors and other dice with large number of contact pads might be mounted by tape automated bonding. Transistor dice or other dice with only a few contacts may be mounted by the above-described wire bonding or flip chip techniques on the same substrate. Component dice which generate significant amounts of heat are preferably mounted using the flip chip technique to provide a surface to attach materials to enhance thermal conduction.

In an encasing step 90, the construction is sealed in an appropriate dielectric shell 92.

In the alternate embodiment, component dice are not interconnected with each other in operative circuits. Rather, such interconnection is uniquely selected in accordance with the localized coil or other in-magnetic field application with which the circuit component is to be utilized. For example, in the FIG. 2 coil, each of the five loops 52a–52e can be connected by transistors of the switching transistor array 72c with amplifiers 72b. Additional transistors of the array can connect the amplifier outputs with the multiplexer 72e. The microprocessor 72a can control the multiplexer and transistors to connect the outputs of the amplifiers cyclically with the analog-to-digital converter 72f. The analog-to-digital convertor may be connected by an additional amplifier of the amplifier array 72b with the cable 56 which connects the localized coil to the receiver 40. Other components can also be provided such as laser diodes, integrated circuits, mixers for mixing the signal with a carrier, and the like.

The operator on the console D may select other modes of using the localized coil. Control signals and electrical power are conveyed along conductors of cable 56 to cause the microprocessor 72a to change the state of various transistors in the transistor array 72c. For example, the transistors can connect coil segments into different combinations, e.g. in series with each other. In another mode, the transistor array 72c can connect all of the surface coil segments 52a–52e in parallel, such that all five act in unison as a single localized coil. Other combinations of coil segments and other modes of interconnecting them are also contemplated.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. In a magnetic resonance apparatus which includes a means for creating a magnetic field through an examination region; a means for exciting nuclei of a subject within the examination region to emit radio frequency magnetic resonance signals; a radio frequency receiving coil means disposed closely contiguous to the examination region for receiving the magnetic resonance signals; a magnetic resonance signal processing circuit for processing the magnetic resonance signals received by the radio frequency receiving coil means; a radio receiver for receiving magnetic resonance signals from the resonance signal processing circuit, the receiver means being disposed outside of the examination region; a data reconstruction means operatively connected with the receiver means for processing the received data; a memory means for storing the processed data for selected display; THE IMPROVEMENT COMPRISING:

constructing the magnetic resonance signal processing circuit using one of chip and wire hybrid, flip chip, and tape automated bonding technology in which a plurality of ferrous-free unpackaged dice are mounted and bonded to a substrate having electrical lead lines defined thereon, the dice are bonded by one of whiskers, raised solder bumps, and conductive lead lines on flexible tape directly to electrically conductive layers of the dice and the substrate lead lines.

2. The apparatus as set forth in claim 1 wherein the unpackaged dice include an unpackaged microprocessor die.

3. The apparatus as set forth in claim 1 wherein the dice include at least one of an unpackaged diode die, an unpackaged transistor die, and an unpackaged microprocessor die, and an unpackaged analog to digital converter die.

4. A magnetic resonance apparatus comprising:

a means for creating a magnetic field through an examination region;

a means for exciting nuclei of a subject within the examination region to emit radio frequency magnetic resonance signals;

a radio frequency receiving coil means disposed in or closely contiguous to the examination region for receiving the magnetic resonance signals, the coil means including at least one coil segment and a magnetic resonance signal processing circuit constructed using at least one of chip and wire hybrid technology, flip chip technology, and tape automated bonding technology, the signal processing circuit including:

a substrate having lead lines defined thereon;

a plurality of unpackaged, ferrous-free dice bonded to the substrate, the ferrous-free dice including at least one of unpackaged microprocessor, unpackaged diode, unpackaged transistor, unpackaged multiplexer, and unpackaged analog-to-digital converter dice;

electrical conductor means bonded to the substrate lead lines and to electrically conductive portions of the at least one ferrous-free die;

a radio receiver for receiving magnetic resonance signals from the resonance signal processing circuit, the receiver means being disposed outside of the examination region;

a data reconstruction means operatively connected with the receiver means for processing the received data;

a memory means for storing the processed data for selected display on a video monitor.

5. The apparatus as set forth in claim 4 wherein the processing circuit is constructed using the flip chip technology and wherein the electrical conductor means includes a solder covered conductive member which is bonded both to the substrate lead lines and to the conductive portions of the unpackaged die.

6. The apparatus as set forth in claim 4 wherein the magnetic resonance signal processing circuit is constructed using tape automated bonding technology and wherein the electrically conductive means includes a plurality of electrical lead lines defined on a flexible insulating tape layer, the tape lead lines being bonded at one end to the electrically conductive portions of the die and at another end to the substrate lead lines.

7. A magnetic resonance apparatus comprising:

a means for creating a magnetic field through an examination region;

a radio frequency coil surrounding the examination region;

a radio frequency transmitter for providing radio frequency signals to the radio frequency coils for exciting nuclei of a subject within the examination region to emit radio frequency magnetic resonance signals;

a magnetic resonance signal processing circuits mounted at the radio frequency coil, the magnetic resonance signal processing circuit including:

substrates having lead lines defined thereon, ferrous-free dice mounted to the substrates, the dice including an unpackaged analog-to-digital converter dice for converting magnetic resonance signals received by the radio frequency coil from analog-to-digital format at the radio frequency coil, an electrically conductive means connected to the substrate lead lines and to electrically conductive portions of the analog-to-digital converter dice;

a digital radio frequency receiver for receiving digital magnetic resonance signals from the resonance signal processing circuits;

a data reconstruction means operatively connected with the digital receiver means for processing the received data;

a memory means for storing the processed data for selective display on a video monitor.

8. The apparatus as set forth in claim 7 wherein the magnetic resonance signal processing circuits further includes unpackaged, ferrous-free microprocessor dice for digitally processing received magnetic resonance signals at the radio frequency coil.

9. The apparatus as set forth in claim 7 wherein the electrical means for bonding the electrically conductive die portions to the substrate lead lines includes a length of electrical conductor defined on a flexible tape.

10. The apparatus as set forth in claim 7 wherein the electrical conductive means includes a solder bump which is electrically bonded to the substrate lines and to electrically conductive portions of the die.

11. The apparatus as set forth in claim 10 wherein the solder bump includes a solder covered sphere.

12. The apparatus as set forth in claim 7 wherein the electrical conductive means includes non-ferrous conductive whiskers.

13. A receiving coil which is configured to be received within or closely contiguous to an examination region of a magnetic resonance apparatus for receiving radio frequency resonance signals emanating from an adjacent subject in the examination region, the receiving coil comprising:

an insulating member;

at least one coil segment supported by the insulating member;

a magnetic resonance signal processing circuit mounted on the insulating sheet and connected with the coil segment for processing signals received by the coil segment, the signal processing circuit including:

a substrate, lead lines defined on the substrate, at least one ferrous-free unpackaged die including at least one of: an unpackaged diode die, an unpackaged analog-to-digital converter die, an unpackaged transistor die, and an unpackaged microprocessor die, mounted to the substrate and electrically connected to the lead lines.

14. The coil as set forth in claim 13 further including a shielding conductive layer on at least one of the substrate and a protective covering.

15. A signal processing circuit for mounting in or contiguous to a subject receiving region of a magnetic resonance apparatus, the signal processing circuit including:

an insulating substrate;

a plurality of electrically conductive lead lines defined along the substrate;

a plurality of ferrous-free unpackaged component dice;

non-ferrous electrical connecting means for directly connecting electrically conductive portions of the dice to the electrically conductive lead lines.

16. The circuit as set forth in claim 15 wherein the electrical conducting means includes at least one of: (i) whiskers such that conductive portions of the dice are wire bonded to the conductive lead lines of the insulating substrate, (ii) solder bumps such that conductive portions of the dice are connected to the lead lines by flip chip technology, and (iii) electrically conductive lines defined along flexible tape such that electrically conductive portions of the dice are bonded to the substrate lead lines by tape automated bonding.

17. The circuit as set forth in claim 15 wherein the substrate is mounted at a radio frequency receiving coil and the dice include at least a ferrous-free, unpackaged analog-to-digital converter die for converting radio frequency magnetic resonance signals received by the receiving coil from analog format to digital format at the radio frequency receiving coil.

18. The circuit as set forth in claim 17 wherein the dice further include a ferrous-free unpackaged microprocessor die which is connected with the analog-to-digital converter die such that digital signal processing operations are performed on the magnetic resonance signal at the radio frequency receiving coil.

\* \* \* \* \*